US012259603B2

(12) United States Patent
Frantz et al.

(10) Patent No.: US 12,259,603 B2
(45) Date of Patent: Mar. 25, 2025

(54) THERMALLY TUNED OPTICAL DEVICES CONTAINING CHALCOGENIDE THIN FILMS

(71) Applicant: The Government of the United States of America, as represented by the Secretary of the Navy, Arlington, VA (US)

(72) Inventors: Jesse Frantz, Washington, DC (US); Jason Myers, Alexandria, VA (US); Vinh Q. Nguyen, Fairfax, VA (US); Jasbinder Sanghera, Ashburn, VA (US); Robel Bekele, Washington, DC (US); Anthony Romano Clabeau, Alexandria, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 530 days.

(21) Appl. No.: 17/449,349

(22) Filed: Sep. 29, 2021

(65) Prior Publication Data

US 2022/0100009 A1 Mar. 31, 2022

Related U.S. Application Data

(60) Provisional application No. 63/084,939, filed on Sep. 29, 2020.

(51) Int. Cl.
*G02F 1/01* (2006.01)
*G02B 1/10* (2015.01)
*H01L 21/02* (2006.01)

(52) U.S. Cl.
CPC ............ *G02F 1/0147* (2013.01); *G02B 1/10* (2013.01); *H01L 21/02568* (2013.01); *G02F 2202/30* (2013.01)

(58) Field of Classification Search
CPC .................. G02F 1/3555; G02F 1/213; C03C 3/321–3/323
See application file for complete search history.

(56) References Cited

U.S. PATENT DOCUMENTS

2018/0203261 A1* 7/2018 Hosseini ............... G02F 1/0311

FOREIGN PATENT DOCUMENTS

| WO | WO-2007011727 A1 * | 1/2007 | ............ B82Y 20/00 |
| WO | WO-2013006392 A1 * | 1/2013 | ............ C03B 1/00 |
| WO | WO-2020245582 A1 * | 12/2020 | ............ G02B 1/10 |

OTHER PUBLICATIONS

Sarwat et al. "Strong Opto-Structural Coupling in Low Dimensional GeSe3 Films", Nano Letters, 19, (2019); pp. 7377-7384.*

(Continued)

*Primary Examiner* — Prashant J Khatri
(74) *Attorney, Agent, or Firm* — US Naval Research Laboratory; Scott C. Hatfield

(57) ABSTRACT

Tunable devices and methods for fine tuning the optical responses of thin film devices post fabrication are described. This approach modifies the refractive indices of the chalcogenide glass thin films incorporated into the devices, and using this change in the refractive indices to fine tune the optical responses of the devices. Thermal annealing may be (Continued)

used to modify the refractive index. Thermal annealing provides good uniformity in large-area devices and may be applied to multi-layer structures.

7 Claims, 7 Drawing Sheets

(56) References Cited

OTHER PUBLICATIONS

Ledemi et al. "Transmission enhancement in chalco-halide glasses for multiband applications", Optical Materials Express, vol. 4, No. 8, (2014); pp. 1725-1739.*
Herzog et al. "Chalcogenide waveguides on a sapphire substrate for mid-IR applications", Optics Letters, vol. 39, No. 8, (2014); pp. 2522-2525.*
Markos, C. "Thermo-tunable hybrid photonic crystal fiber based on solution-processed chalcogenide glass nanolayers", Scientific Reports, 6:31711, (2016); pp. 1-8.*
Martin-Palma et al. "Fabrication of two-dimensional photonic crystals in a chalcogenide glass", International Journal of Nanotechnology, vol. 6, No. 12, (2009); pp. 1113-1120.*
Nath et al. (eds. Pham et al.). "Chalcogenide glass thin-film optics for infrared applications", Sensors and Systems for Space Applications VII, Proceedings of the SPIE, vol. 9085, (2014); pp. 908507-1 to 908507-7.*
Kohoutek et al. "All-chalcogenide middle infrared dielectric reflector and filter", Journal of Non-Crystalline Solids, 357, (2011); pp. 157-160.*
Xu et al. "Infrared metamaterial absorber by using chalcogenide glass material with a cyclic ringdisk structure", OSA Continuum, vol. 1, No. 2, (2018); pp. 573-580.*
Frantz et al. (eds. Soskind et al.). "Thermally Tuned Resonances in Chalcogenide Glass Dielectric Metasurfaces", Photonic Instrumentation Engineering VII, vol. 11287, (2020); pp. 1128701-1 to 1128701-7.*
Kohoutek et al., "Preparation of dielectric mirrors from high-refractive index contrast amorphous chalcogenide films," Journal of Physics and Chemistry of Solids, vol. 69, Issue 8, Aug. 2008, ages 2070-2074.
Todorov et al., "Multilayer As2Se3/GeS2 quarter wave structures for photonic applications," Journal of Physics D: Applied Physics, vol. 43, Dec. 2010, 8 pages.
Shen et al., "Photosensitive post tuning of chalcogenide Te20As30Se50 narrow bandpass filters," Optics Communications, vol. 281, Issue 14, Jul. 15, 2008, pp. 3726-3731.

Kohoutek et al., "Planar chalcogenide quarter wave stack filter for near-infrared," Journal of Non-Crystalline Solids, vol. 355, Issues 28-30, Aug. 15, 2009, pp. 1521-1525.
Bourgade et al., "Large aperture, highly uniform narrow bandpass Fabry-Perot filter using photosensitive As2S3 thin films," Optics Letters, vol. 44, Issue 2, Jan. 15, 2019, pp. 351-354.
Choi et al., "Photo-induced and Thermal Annealing of Chalcogenide Films for Waveguide Fabrication," Physics Procedia, vol. 48, 2013, pp. 196-205.
Frantz et al., "Thermally tuned resonances in chalcogenide glass dielectric metasurfaces," Proc. SPIE 11287, Photonic Instrumentation Engineering VII, Mar. 2, 2020, 8 pages.
Frantz et al., "Chip-based nonmechanical beam steerer in the midwave infrared," Journal of the Optical Society of America B, vol. 35, Issue 12, Dec. 2018, 9 pages.
J.P. Neufville, et al., "Photostructural Transformations in Amorphous As2Se3 and As2S3 Films," J. Non-Cryst. Solids (NL), vol. 13, Issue 2, pp. 191-223 (Jan. 1974).
Zhang, et al., "Production of complex chalcogenide glass optics by molding for thermal imaging," J. Non-Cryst. Solids (NL), vol. 326-327, pp. 519-523, 2003.
Gibson, D., et al., "IR-GRIN optics for imaging," Proc. SPIE (US), vol. 9822, pp. 98220R-1 to 98220R-9, 2016.
Sanghera, J. S., et al., "Chalcogenide Glass-Fiber-Based Mid-IR Sources and Applications," IEEE J. Sel. Top. Quantum Electron. (US), vol. 15, No. 1, pp. 114-119, Jan./Feb. 2009.
Eggleton, B. J., et al., "Chalcogenide Photonics," Nat. Photonics (UK), vol. 5, pp. 141-148, Feb. 28, 2011.
Frantz, J. A., et al., "Waveguide amplifiers in sputtered films of Er3+-doped gallium lanthanum sulfide glass," Opt. Express (US), vol. 14, No. 5, pp. 1797-1803, 2006.
Harbold, J. M., et al., "Highly nonlinear Ge—As—Se and Ge—As—S—Se glasses for all-optical switching," IEEE Photonics Technol. Lett. (US), vol. 14, No. 6, pp. 822-824, Jun. 2002.
Xu, Y., et al., "Reconfiguring structured light beams using nonlinear metasurfaces," Opt. Express (US), vol. 26, vol. 23, pp. 30930-30943, Nov. 12, 2018.
Xu, Y., et al., "Nonlinear Metasurface for Structured Light with Tunable Orbital Angular Momentum," Appl. Sci. (CH), vol. 9, No. 5, p. 958, 2019.
Frantz, J. A., et al., "Arsenic selenide dielectric metasurfaces," Proc. SPIE (US), vol. 10914, 109140A-1 to 109140A-7, Feb. 27, 2019.
Frantz, J. A., et al., "Arsenic selenide thin film degradation and its mitigation," Opt. Mater. Express (US), vol. 8, No. 12, pp. 3659-3665, Dec. 2018.
Frantz, J. A., et al., "Thermal tuning of arsenic selenide glass thin films and devices," Opt. Express (US), vol. 28, No. 23, pp. 34744-34753, Nov. 9, 2020.

* cited by examiner

THERMALLY TUNED OPTICAL DEVICES CONTAINING CHALCOGENIDE THIN FILMS

CROSS-REFERENCE TO RELATED APPLICATIONS

This application is a non-provisional of and claims the benefit of U.S. provisional application No. 63/084,939, filed on Sep. 29, 2020, the entirety of which is incorporated herein by reference.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, DC 20375, USA; +1.202.767.7230; nrltechtran@us.navy.mil, referencing Navy Case #113682-US2.

BACKGROUND

Thin films of chalcogenide glasses (ChGs) are of interest for a variety of photonics applications, such as metamaterials, structured light, novel methods of beam control, non-linear optics and optical switching. ChGs exhibit high linear refractive indices, enabling high index contrast structures. They have large optical nonlinearities, making them useful for tunable devices and nonlinear frequency conversion. They also have wide transmission windows extending from the visible through the long-wave infrared.

Thin film dielectric stacks that include chalcogenide layers have long been of interest for certain devices, such as mirrors and filters. The high index contrast that they enable results in high efficiency with relatively few layers. Additionally, the infrared transmission bands of ChGs permit devices with high transmission in bands where traditional thin film material are highly absorbing.

While there are clear potential benefits to using ChGs in thin film devices, a concern remains that the precise properties of such structures may be difficult to control. This is because these materials are multicomponent glasses, deposited films are subject to slight run-to-run deviations in composition and bonding that may lead to variations in their optical properties. The composition of chalcogenide-containing films is especially challenging to control because some fraction of the chalcogen element can be lost to the vapor phase, a phenomenon that can be sensitive to both source material conditions and deposition parameters.

Accordingly, ChG films are rarely used in devices, such as filters, because of the deviations in composition of ChGs and bonding as well as fabrication tolerances. One approach to address these issues includes fully annealing devices to achieve equilibrium properties, which provides better control over the refractive index than with no annealing. However, this approach results in fixed optical properties but not necessarily to design specifications. Another approach includes a photo-induced index change, which permits tuning of the optical response. However, there is poor control over the change in the refractive index, especially over large areas. Also, the wavelength tuning range is limited. In addition, the depth at which absorption occurs cannot be easily controlled, thus it is not suitable for multilayer structures.

SUMMARY

Methods of post-fabrication tuning of the optical response of devices containing chalcogenide thin films are described. Devices with a tunable optical response that employ this method are also described.

An optical device is described herein. The optical device comprises a chalcogenide glass layer that has an optical index of refraction that is configured to be thermally tuned post deposition to adjust a wavelength response and a substrate adjacent to the chalcogenide glass layer.

A method for fabricating an optical device is also described herein. The method comprises selecting a chalcogenide glass having a refractive index that is configured to be tuned post deposition. The method further includes determining an as-deposited value and a maximum value of the refractive index of the chalcogenide glass. An intermediate value that is based on the as-deposited value and the maximum value is determined. A desired wavelength for a position of a feature in a spectral response of the optical device is also selected. The optical device is designed, incorporating the chalcogenide glass, with the intermediate value to produce the feature at the desired wavelength. The optical device is fabricated. The optical device is annealed and the spectral response of the optical device is measured. Upon determining that the desired wavelength has not been reached, the annealing and measuring steps are repeated until the desired wavelength is reached.

A tunable metasurface device is also provided. The device comprises a chalcogenide glass layer that has an optical index of refraction that is configured to be thermally tuned post deposition to adjust a resonance of the metasurface device.

Further features and advantages of the invention, as well as the structure and operation of various embodiments are described in detail below with reference to the accompanying drawings.

DETAILED DESCRIPTION

Definitions

Figure 2:
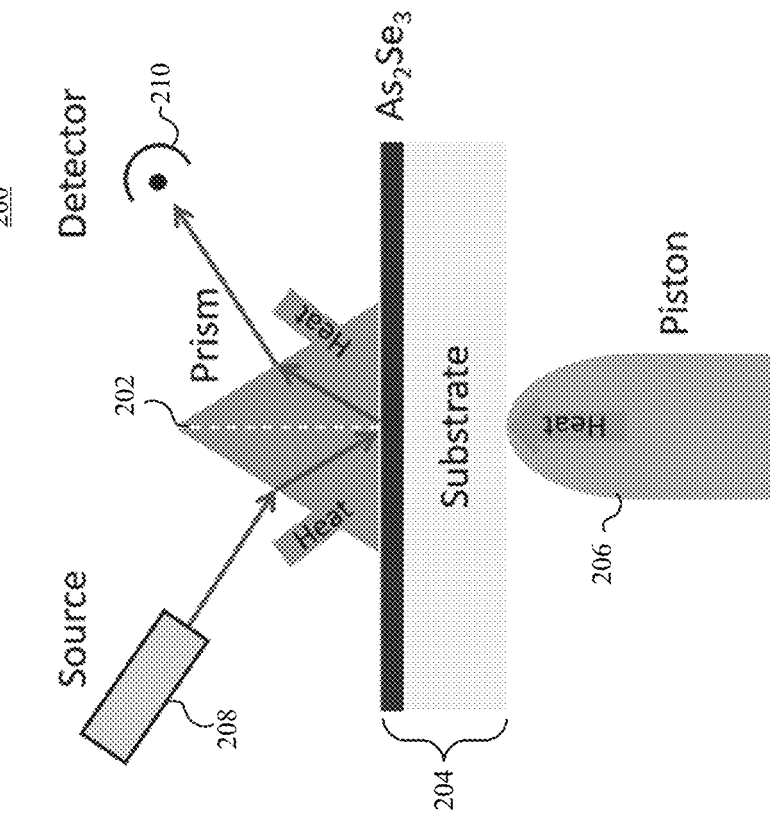
FIG. 2 depicts a system with a prism coupler for performing measurements with in situ heating.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a feature, structure, or characteristic is described in connection with an embodiment, it is submitted that it is within the knowledge of one skilled in the art to effect such feature, structure, or characteristic in connection with other embodiments whether or not explicitly described.

In describing and claiming the disclosed embodiments, the following terminology will be used in accordance with the definition set forth below.

As used herein, the singular forms "a," "an," "the," and "said" do not preclude plural referents, unless the content clearly dictates otherwise.

As used herein, the term "and/or" includes any and all combinations of one or more of the associated listed items.

As used herein, the term "about" or "approximately" when used in conjunction with a stated numerical value or range denotes somewhat more or somewhat less than the stated value or range, to within a range of ±10% of that stated.

Terminology used herein should not be construed as being "means-plus-function" language unless the term "means" is expressly used in association therewith.

Overview

Most vacuum deposition methods are non-equilibrium processes and result in ChG films with bonding that differs in character from that on an annealed bulk sample. To mitigate the effect of deposited thin films with bonding that differs in character from that of an annealed bulk sample, it is possible to shift the resonance of a ChG metasurface via thermal tuning. There are several advantages to controlled thermal annealing. Unlike tuning achieved by light exposure, thermal tuning may be applied to multi-layer structures without regard to changes in irradiance caused by layers above or below a given layer. In addition, with thermal tuning it is straightforward to anneal a large-area device with good uniformity.

Described herein is a technique to modify the refractive index, n, of a ChG thin films incorporated into an optical device, and using this change in the refractive index, Δn, to modify the optical response of the device. This tuning approach may be applied in a number of photonic applications that use ChG film(s). Examples in the linear regime include passive waveguides, sensors, and nonmechanical beam steerer devices. Nonlinear application examples include waveguides for supercontinuum generation and integrated optic devices based on Brillouin scattering. Specific examples of filters and mirrors/reflectors, in particular Fabry-Perot filters and Bragg reflectors, are provided for illustrative purposes. When arsenic selenide ($As_2Se_3$) films are used as the ChG layers, these devices showed significant shifts in the center of the transmittance peak for the Fabry-Perot filters and the long wavelength edge of Bragg reflectors, for example, approximately 40 nm in magnitude. The magnitude of the observed shifts is substantial, making this technique a useful way to achieve tunability in thin film devices for various applications.

EXAMPLE EMBODIMENTS

Metamaterials are composite materials, typically made of subwavelength metallic or dielectric structures, designed to have unique electromagnetic properties. A metasurface is a two-dimensional material that has all the properties of a particular metamaterial and may provide a solution to limitation(s) of the metamaterial. Metasurfaces may be utilized for optical elements, yielding a performance that is higher than conventional optical elements. A common challenge in metastructure fabrication is precisely tuning of the frequency of a metastructure device's resonance. The method described herein allows the tuning of a dielectric metastructure's resonance by thermally adjusting the refractive index of a ChG glass material. For example, a metasurface device may be designed and built with resonances slightly off (e.g., blue-shifted or red-shifted) from their desired positions, and thermal tuning is then used to shift them to the desired positions.

ChGs are good candidates for use in dielectric metastructures because they exhibit high linear refractive indices, enabling high index contrast devices. They also have large optical nonlinearities, making them useful for tunable devices and nonlinear frequency conversion. They also have wide transmission windows extending from the visible through the long-wave infrared.

The electromagnetic spectrum includes the visible and near infrared bands. Infrared (IR) refers to the region between the visible and the terahertz regions of the electromagnetic spectrum. Heated objects (e.g., with temperature above 0 K) radiate energy, and the higher the temperature of an object, the higher the spectral radiant energy or emittance. The IR region is sometimes divided into three smaller regions, the short-wave infrared (SWIR), the mid-wave infrared (MWIR) and the long-wave infrared (LWIR). Detection systems that operate in the visible and near infrared bands have high resolution, are widely deployed, and may experience reduced visibility in adverse atmospheric conditions. Detectors in the SWIR band may provide haze penetration, high resolution, and offer good compatibility with visible systems. Systems operating in the visible, near infrared, and SWIR bands require illumination as they use reflective light, and objects may have shadows. Systems that operate in the MWIR and LWIR bands may provide "passive" imaging without requiring illumination as they use light emitted by the subject, and thus may operate in complete darkness.

ChGs are amorphous semiconductors that contain, as a major constituent, one or more chalcogen elements—sulfur (S), selenium (Se), and tellurium (Te)—covalently bonded to network formers such as gallium (Ga), germanium (Ge), arsenic (As), indium (In), antimony (Sb), or lead (Pb). In embodiments, ChG films may include one or more chalcogen elements (e.g., S, Se or Te); elements to form stable glasses (e.g., elements in groups 5-7 of the periodic table of elements); halides (e.g., elements in group 8 of the periodic table of elements), particularly oxygen to form oxy-chalcogenide; and rare earth ions (e.g., elements in the lanthanide series). For example, undoped ChGs may include As—S, As—Se, Ge—S—Br, As—S—Se, As—Se, Ge—As—Se—Te, or Ge—As—Te—I. Examples of ChGs that are suitable for rare earth doping may include Ge—Ga—S, Ge—As—Ga—S, Ga—La—S, Ge—S—I, and Ge—As—Ga—Se. In embodiments, the composition of the ChG may be chosen so that the device that includes the ChG material may have a higher or lower annealing temperature as desired. These ChGs have significantly different properties than oxide glasses and are thus of interest for a variety of linear and nonlinear optical applications. Their low phonon energies result in wide transmission windows that, depending on composition, may extend from the visible through the long-wave infrared. They may be used for bulk optics, optical fiber, and planar photonics applications that take advantage of this infrared transmission. Their extraordinarily high optical nonlinearity, with values of $n_2$ that are 1000 times greater or more than that of silica, make them useful for a variety of nonlinear applications. The ease of fabricating ChGs is also appealing.

A ChG may be formed in various ways (e.g., deposited via thermal evaporation), with the film's composition closely matching that of the deposition source material. For example, bulk chalcogenide glass may be synthesized as follows. ChGs samples may be batched from purified precursors in a nitrogen ($N_2$) gas purged glovebox. A melt may be formed by heating the precursors in a sealed quartz ampoule, for example, at 750° C. for 10 hours, in a rocking furnace. The glass melt may be quenched in air or in water and annealed. The glass boule may be removed from the quartz ampoule and broken into small pieces to be used as deposition sources.

ChG films may become cloudy under atmospheric conditions. However, while unprotected films may degrade in air, aided by the presence of light and moisture, it is possible to passivate these films with a passivation layer. For example, in embodiments, atomic layer deposition-deposited alumina (e.g., 5-50 nm thick) may be used as the passivation layer. Alternatively, other suitable passivation layers, such as an environmentally-robust chalcogenide glass, may be used. This passivation keeps the films pristine for long periods without any measurable degradation in their optical properties, especially when above band gap light exposure is also avoided.

Figure 1:
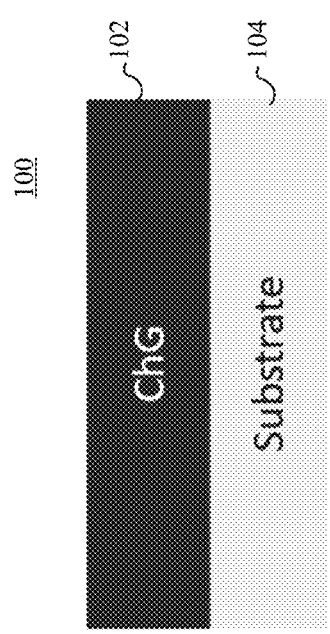
FIG. 1 depicts a thin film stack that includes a layer of a ChG material on a substrate, according to an example embodiment.

FIG. 1 depicts a thin film stack that includes a layer of a ChG material on a substrate, according to an example embodiment. In embodiments, thin film stack 100 shown in FIG. 1 may be configured for photonic applications as simple optical thin film devices that may operate in a range that includes the visible (400 nm) through long range infrared (up to 12 μm) wavelengths. In an embodiment, ChG layer 102 has an optical index of refraction or optical refractive index, n, that is configured to be thermally tuned post deposition to adjust a wavelength response. The refractive index of ChG layer 102 is a number that describes how fast light travels through the ChG material and determines how much the path of light is bent or refracted when entering the material. In embodiments, the tunability in the refractive index is quite large (e.g., greater than 0.1 change). This tuning may occur after growth/deposition or fabrication.

Thin film stack 100 may be used to measure the properties of the thin film, ChG layer 102, including n, and thickness, d, as a function of annealing time, t. ChG layer 102 may be deposited while a substrate 104 may be maintained at a particular temperature (e.g., 25° C.). The resulting films are spatially uniform with low surface roughness (root mean squared roughness being less than 10 Å) and with a composition similar to those of the deposition material.

In an embodiment, the thin film stack may be formed by depositing an arsenic selenide ($As_2Se_3$) film (e.g., 1.5 μm thick) onto a sapphire substrate via thermal evaporation. $As_2Se_3$ is a useful composition for several reasons: 1) its high linear refractive index, n=2.8 (higher than that of arsenic sulfide ($As_2S_3$) with n=2.4), enabling more design flexibility for both waveguides and metasurface applications; 2) its nonlinearity ($n_2$>900 times that of silica); and 3) its band gap of 1.8 eV and wide transmission window, spanning from approximately 1.5-14 μm, making it useful for the SWIR, MWIR as well as the LWIR.

FIG. 2 depicts a system with a prism coupler for performing measurements with in situ heating. In an embodiment, a thin film stack 204 (e.g., comprising $As_2Se_3$ deposited on a substrate) may be measured using prism coupler 202 in various ways. Prism coupler 202 is configured to measure the refractive index and thickness of thin films. The refractive indices of a material depend upon the wavelength of the transmitted electromagnetic radiation. Thus, as shown in FIG. 2, a light source 208 (e.g., laser beam) may be directed through a side of prism coupler 202, having a known refractive index, is bent, and is normally reflected back out the opposite side of the prism into a photodetector 210. Thus, both the refractive index and the thickness of thin film stack 204 may be simultaneously determined by measuring the coupling angles at prism coupler 202 and fitting them by a theoretical dispersion curve. A heated piston 206 may be used to provide heat for the annealing process.

Figure 4:
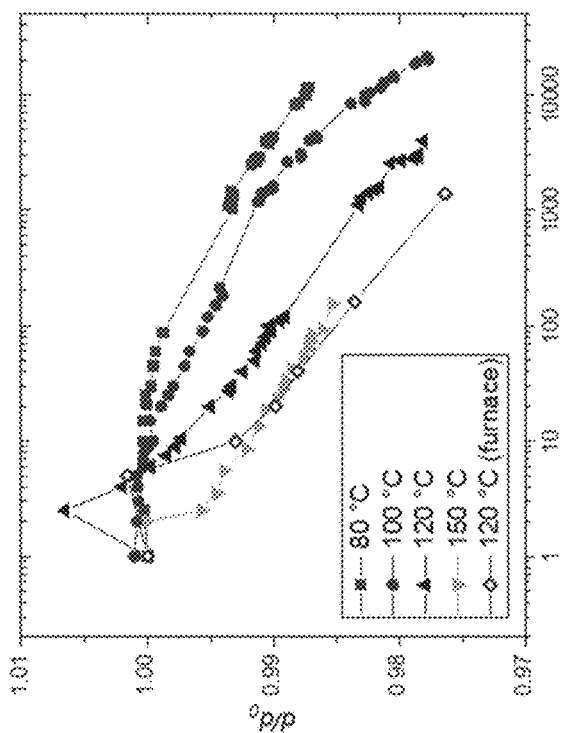
FIG. 4 depicts a plot of normalized film thickness of the film stack shown in FIG. 2 as a function of annealing time.
Figure 5:
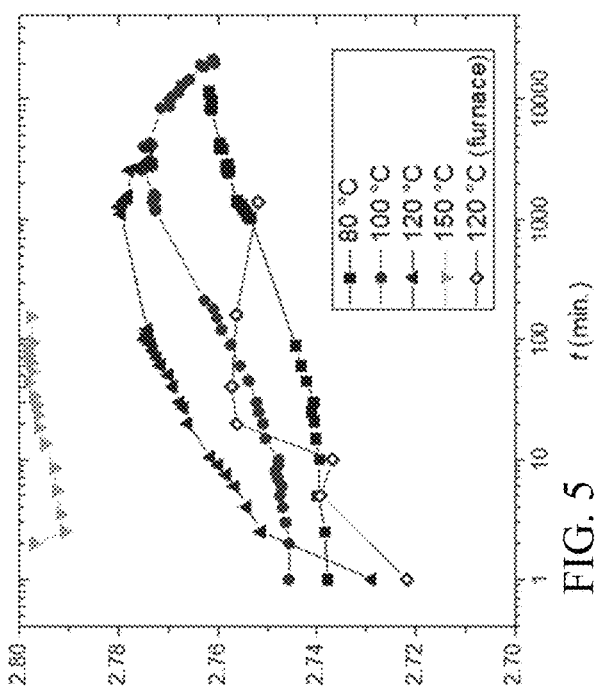
FIG. 5 depicts a plot of fractional optical thickness change of the film stack shown in FIG. 2 as a function of annealing time.
Figure 3:
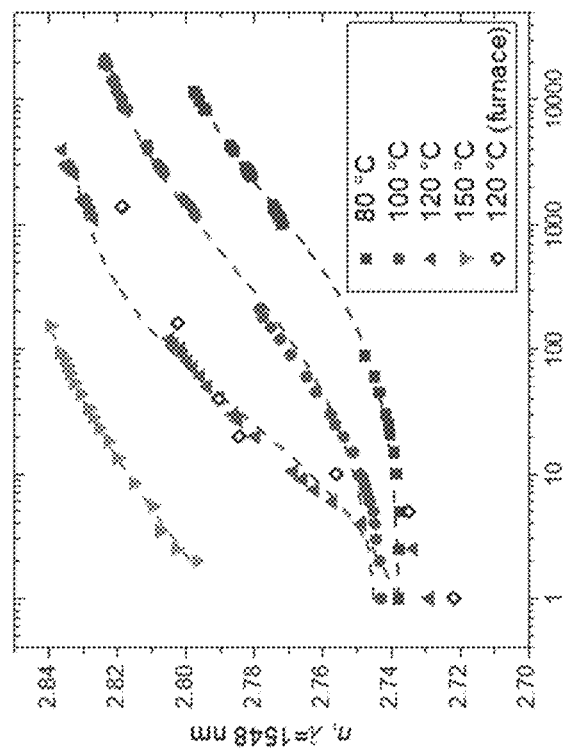
FIG. 3 depicts a plot of representative results of a refractive index for different annealing temperatures for the film stack shown in FIG. 2.

Representative measurements of thin film stack samples (of the arsenic selenide film stack shown in FIG. 2) are shown in FIGS. 3-5. The refractive indices of the samples were measured at =1548 nm using a Metricon 2010/M prism coupler with a heated piston and heated rutile prism. Samples were annealed in situ at four different temperatures and their refractive index values were measured periodically to observe the change in index while the samples were held steady at 80° C., 100° C., 120° C., and 150° C. In addition, a reference sample was heated at 120° C. in a furnace in air and measured later at room temperature in a prism coupler. In the plots of FIGS. 3-5, the furnace-annealed reference sample is shown together with data obtained for in situ-annealed samples. For the surface-annealed sample, anneal time, t, refers to cumulative anneal time (with time out of the furnace for measurement not included). Refractive indices for all samples were measured using transverse electric (TE) polarized light by fitting two or more strongly coupled modes. No significant change in absorption or band edge shift was found.

FIG. 3 is a plot of representative results of a refractive index for different annealing temperatures for the film stack shown in FIG. 2. The refractive index is shown for a range of temperatures, ranging from 80° C. to 150° C., as a function of anneal time. The refractive index is measured at λ=1548 nm. The measured data are indicated by symbols and the fit are indicated by the dashed lines. As seen in FIG. 3, for each temperature, a clear sigmoidal increase from a starting refractive index of approximately 2.73 that asymptotically approaches a final value of greater than 2.8. However, the times required to reach equivalent refractive indices differs by orders of magnitude based on the annealing temperature. For example, n=2.8 is obtained after 2.5 minutes at 150° C., while achieving the same index takes over 2000 minutes at 100° C. Note that the annealing rate at 150° C. is so rapid that the first data point captured after temperature stabilization (approximately 2 minute ramp from room temperature to 150° C.) already shows a significant index change over an unannealed film. The values obtained also correspond well to values measured via ellipsometry, with the as-deposited arsenic selenide having an index value of n=2.730 and n=2.766 after a one-hour furnace anneal at 100° C. Also as seen in FIG. 3, the 120° C. furnace results are similar to those for 120° C. in situ annealing.

FIG. 3 also shows fits to the Hill equation, which is commonly used to approximate the binding of a ligand to a macromolecule in biological processes and is given by $$n = n_{start} + (n_{end} - n_{start})\frac{t^h}{k^h + t^h} \quad (1)$$

where h is the Hill coefficient, k is the reaction velocity constant, and $n_{start}$ and $n_{end}$ are the refractive index values at the beginning and the end of annealing, respectively. Fit parameters for each temperature are shown in Table 1 below.

TABLE 1

| Hill equation fit parameters | | | | |
|---|---|---|---|---|
| Parameter | 80° C. | 100° C. | 120° C. | 150° C. |
| $n_{start}$ | 2.74 | 2.74 | 2.73 | 2.73 |
| $n_{end}$ | 2.81 | 2.83 | 2.84 | 2.86 |
| k | 1320 | 493 | 28.8 | 1.50 |
| h | 0.70 | 0.59 | 0.70 | 0.37 |

The decrease in k is consistent with the increase in reaction speed at higher temperatures. With regards to the Hill coefficient, when h<1, reactive binding slows further binding, a process known as negatively cooperative binding. The Hill equation offers an intuitive understanding of annealing behavior by considering the reactivity of unsatisfied bonding sites within the material. The sites are satisfied through annealing, and as the sites are satisfied, the annealing rate slows due to increased distance between unsatisfied sites. As unsatisfied bonds reorganize under thermal annealing to form a more satisfied bonding structure, the reaction speed of bonding rearrangement slows. This is analogous to the slowing of reactive binding over time in the context of the Hill equation.

FIG. 4 is a plot of normalized film thickness, $d/d_0$, of the film stack shown in FIG. 2 as a function of annealing time for different values of anneal temperature. $d_0$ is the initial, as-deposited film thickness before annealing. The normalized film thickness indicates that higher temperatures lead to much faster changes in thickness, whereas the change is much more gradual at lower temperatures. As shown in FIG. 4, a decrease in d is observed. For thin film devices, there is a concern with the change in optical path length as a function of annealing. The increase in n with anneal time may be counteracted somewhat by the decrease in d in terms of fractional optical thickness change, $n \times d/d_0$. The net effect, however, as shown in FIG. 5, is positive, leveling off for the furnace-annealed samples between 10 and 100 minutes and decreasing slightly for anneals beyond 100 minutes. The total increase in $n \times d/d_0$ for the furnace-annealed samples appear to be less than that of the in situ-annealed samples.

FIG. 5 is a plot of fractional optical thickness change, $n \times d/d_0$, of the film stack shown in FIG. 2 as a function of annealing time. It can be seen in FIG. 5 that this quantity increases as a function of t, indicating that the increase in n outweighs the decrease in d, particularly for shorter annealing times, providing an increase in optical path length. The change in optical thickness is due to three competing mechanisms: refractive index increase due to bond rearrangement, physical thinning due to the applied pressure in the prism coupler, and film densification due to annealing. The roll off in optical thickness that is observed at longer time scales for the 100° C. and 120° C. samples is most likely due to a combination of applied pressure at elevated temperatures and reduced change in refractive index as the annealing process slows.

Values for n and d obtained with the thin film stack 204 shown in FIG. 2, as described above and depicted in FIGS. 3-5, may be used to aid in the design of more complex devices.

Figure 6:
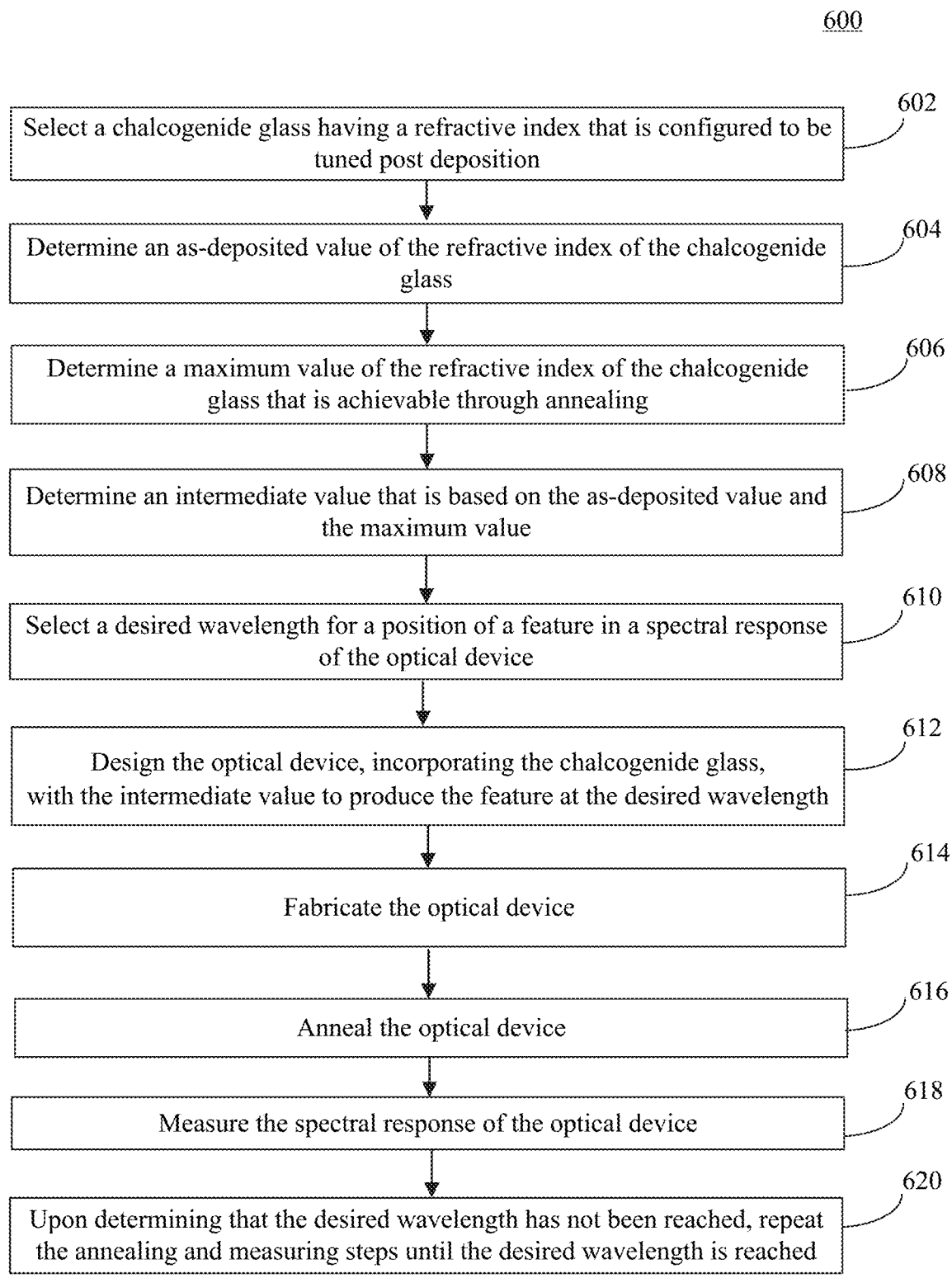
FIG. 6 depicts a flowchart of a method for fabricating an optical device, according to an example embodiment.

Optical devices comprising thin film stacks (e.g., 100 or 204 shown in FIGS. 1 and 2, respectively) may be fabricated in various ways. For instance, FIG. 6 depicts a flowchart 600 for a method for fabricating an optical device, according to an example embodiment. Flowchart 600 may be utilized for fabricating the optical devices (e.g., tunable metasurface devices, filters, reflectors) described in various embodiments.

Flowchart 600 begins with step 602. In step 602, a chalcogenide glass having a refractive index that is configured to be tuned post deposition is selected. For example, arsenic selenide may be selected. Any suitable composition of chalcogenide glass as set forth above may be chosen for a particular application (e.g., operation in the SWIR, MWIR, and/or LWIR bands) and/or based on particular characteristics of the chalcogenide glass, such as high linear refractive index, nonlinearity, band gap value, and transmission window. In an embodiment, arsenic selenide may be selected for its n value, nonlinearity, and band gap of 1.8 eV and wide transmission window.

In step 604, an as-deposited value of the refractive index of the chalcogenide glass is determined. For example, the as-deposited value of the refractive index of the selected chalcogenide glass may be directly measured or via any other method (e.g., using a lookup table, by calculation).

In step 606, a maximum value of the refractive index of the chalcogenide glass that is achievable through annealing is determined. For example, the maximum value may be determined experimentally based on direct measurements. Values obtained for simple devices may be utilized in designing more complex devices.

In step 608, an intermediate value that is based on the as-deposited value and the maximum value is determined. For example, the intermediate value may be a refractive index value that is larger than the as-deposited value and smaller than the maximum value of the refractive index of the chalcogenide glass. Thus, any value between the as-deposited value and the maximum value may be utilized as the intermediate value in embodiments.

In step 610, a desired wavelength for a position of a feature in a spectral response of the optical device. Depending on the application, one or more features of interest may occur at one or more positions in the spectral response, and each position may correspond to a wavelength. This wavelength may be shifted during an annealing process. For example, for a filter design, the applicable feature may be a transmittance peak. As a specific example, a maximum in transmittance may be observed at a wavelength of 1600 nm prior to annealing, and this peak transmittance may be shifted by 40 nm after annealing to 1640 nm. For a reflector design, the applicable feature may be a long wavelength cutoff in reflectance. For example, the long wavelength edge may be shifted by 40 nm after annealing.

In step 612, the optical device may be designed, incorporating the chalcogenide glass, with an intermediate value to produce the feature at the desired wavelength. For example, an intermediate value such as an average of the as-deposited value and the maximum value may be utilized as the intermediate value in designing the optical device such that, after annealing, the optical device may exhibit the feature at the desired wavelength in its spectral response. The optical device may be any device used for a photonic application, such as waveguides, sensors, nonmechanical beam steerer devices, or integrated optic devices and systems. Specific examples of filters and mirrors (e.g., for sensing or imaging systems) will be described in conjunction with FIGS. 7-10.

In step 614, the optical device is fabricated. For example, the optical device may be fabricated, via any suitable technique, resulting in the chalcogenide glass having the as-deposited value for the index of refraction. Any number and/or type of chalcogenide thin film deposition methods may be utilized to form the different layers of a film stack in the fabrication process, for example, thermal evaporation, sputtering, electron beam evaporation, atomic layer deposition, and chemical vapor deposition.

For example, a film stack may be formed by depositing an arsenic selenide ($As_2Se_3$) film (e.g., 1.5 μm thick) onto a sapphire wafer via thermal evaporation (e.g., using a Kurt J. Lesker PVD75 thermal evaporator) from an aluminum oxide crucible. As another example, a fabrication process for metasurface samples may include covering two-side polished silicon (Si) wafers with a 200 nm thick layer of arsenic selenide, and then by photoresist (eS1805), and features may be patterned in the photoresist using a laser direct write tool with a minimum resolution of 0.6 μm. After the photoresist is developed, the pattern may be transferred to the arsenic selenide via wet and/or dry etching.

In step 616, the optical device is annealed. For example, after deposition and initial measurements of various properties (e.g., index of refraction, thickness, transmittance as a function of wavelength), the device may be annealed in a furnace in air and/or in-situ annealed at a particular temperature. Thermal annealing is a heat treatment process that modifies the physical (e.g., mechanical or electrical) and/or chemical properties of a material, and generally includes heating the material above its recrystallization temperature, maintaining an appropriate temperature for a period of time, and then cooling. For example, the device may be heated at a wide range of temperature, e.g., 80° C., 100° C., 120° C., and 150° C. and a wide range of annealing time, e.g., from one to greater than 10000 minutes. Depending on the annealing time and temperature, the optical device may exhibit different properties. Thus, in embodiments, optical devices may be designed and built with resonances that are slightly off from their desired positions, and thermal tuning may be used to shift them to the desired positions.

In step 618, the spectral response of the optical device is measured. The spectral response or wavelength response may be determined in any suitable manner. For example, the measurements of transmittance, T, and reflectance, R, may be determined in various transmission bands in a spectrophotometer. In an embodiment, the refractive index for a device may be measured using a prism coupler (e.g., Metricon 210/M) at a particular wavelength (e.g., 1548 nm). Measurements of transmittance may be performed in the visible through the SWIR in a spectrophotometer (e.g., Cary 7000) and in the MWIR through LWIR using a Fourier transform infrared spectrometer (e.g., Analect Diamond 20). Profiles of fabricated devices may be obtained with a confocal microscope.

In step 620, upon determining that the desired wavelength has not been reached, the annealing and measuring steps may be repeated until the desired wavelength is reached. For example, steps 616 and 618 may be repeated as necessary to tune the device such that it exhibits the desired wavelength. Once the desired wavelength is reached, the tuning process of the optical response of the device may be terminated.

According to method 600, optical devices containing at least one layer of ChG material may be made such that the ChG material is deposited with non-equilibrium bonding configuration (i.e., deposited in a non-equilibrium state). The ChG material undergoes a structural transformation akin to polymerization upon thermal annealing to provide tuning that is permanent and one-way. This enables fine tuning of the optical response of the device post-fabrication. This method may be applied to multi-layer structures, and it permits annealing a large-area device with good uniformity.

Optical devices may be modeled, for example, using a matrix method via FilmStar™ software (FTG Software Associates). Dispersion may be accounted for using Sellmeier coefficients obtained from bulk samples. For partially annealed samples, the ChG films may exhibit refractive indices less than those of bulk glass, thus the change in the refractive index may be negative. Thus, it may be treated as a constant offset, i.e., the shape of the dispersion curve may be taken to be the same independent of annealing time, but shifted by a constant offset that may be determined experimentally. Some embodiments described herein may include description of data measured from fabricated devices as well as simulated data based on the model for comparison purposes.

For example, metasurface samples and/or devices may modeled as an array of square holes in an arsenic selenide film arranged in a square array. The substrate may be crystalline silicon, and the metasurface may be bordered on the top by air. The hole may be filled with air as well. The lattice constant, a, may be fixed at a particular value (e.g., 2 μm), and the thickness of the film, t, may be also be fixed at a particular value (e.g., 200 nm), as well as the width of the hole, w (e.g., 1.12 μm). The free space wavelength, $\lambda_0$, ranged from 1.0 to 4.0 μm. The thicknesses of the air and silicon layers may be set to 4.0 μm. The metasurface samples may be modeled using a finite element model in COMSOL Multiphysics. The sides of the unit cell may be treated as periodic boundaries, so modeling an individual unit cell permitted the prediction of the response of an infinite array of holes.

Figure 7:
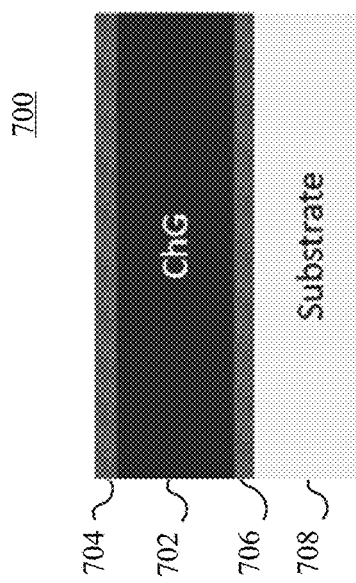
FIG. 7 depicts a Fabry-Perot filter, according to an example embodiment.

FIG. 7 depicts a Fabry-Perot filter or resonator, according to an example embodiment. Designed to work in transmission, filter 700 comprises a ChG layer 702 formed between a first reflector 704 and a second reflector 706, deposited on a substrate 708. In an embodiment, reflectors 704 and 706 may be metal films or thin film dielectric mirrors. Filter 700 has a maximum in transmittance at a wavelength determined by the resonance of the optical cavity. ChG layer 702 may be composed of the different combinations of elements described above, such as sulfur, selenium, and tellurium, among others, based on the application and/or configuration of filter 700. Substrate 708 may be any suitable substrate, for example, sapphire or silica. In an embodiment, filter 700 includes 277.8 nm thick arsenic selenide ($As_2Se_3$) film sandwiched between 30 nm thick layers of aluminum on a silica ($SiO_2$) substrate.

Figure 8:
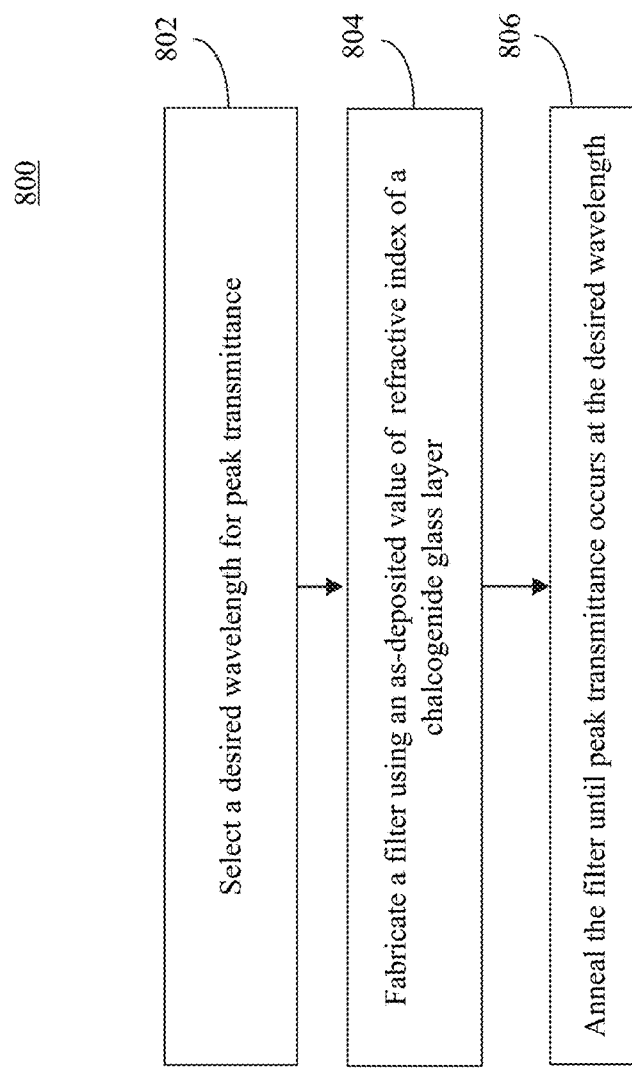
FIG. 8 depicts a flowchart of a method for forming a filter, according to an example embodiment.

FIG. 8 depicts a flowchart of a method for forming a filter, according to an example embodiment. Flowchart 800 shown in FIG. 8 begins with step 802, in which a desired wavelength for peak transmittance of a filter (e.g., filter 700) is selected. Based on the application and/or configuration of the filter, a particular wavelength for peak transmittance, T, may be selected. In step 804, the filter may be fabricated using an as-deposited value of a refractive index of a chalcogenide glass layer. For example, chalcogenide glasses may have different refractive index values depending on their composition. In an embodiment, the ChG material may be deposited via thermal evaporation while the substrate may be maintained at a particular temperature (e.g., 25° C.), and the aluminum reflectors may be deposited by electron beam evaporation. In other embodiments, any suitable fabrication technique(s) may be utilized. In step 806, the filter is annealed until peak transmittance occurs at the desired wavelength. For example, once the filter is fabricated and annealed, its optical response may be measured to determine whether the desired wavelength is achieved. If not, the filter may be further annealed and measured until the desired wavelength for peak transmittance is reached, at which point the tuning process may be terminated.

Figure 10:
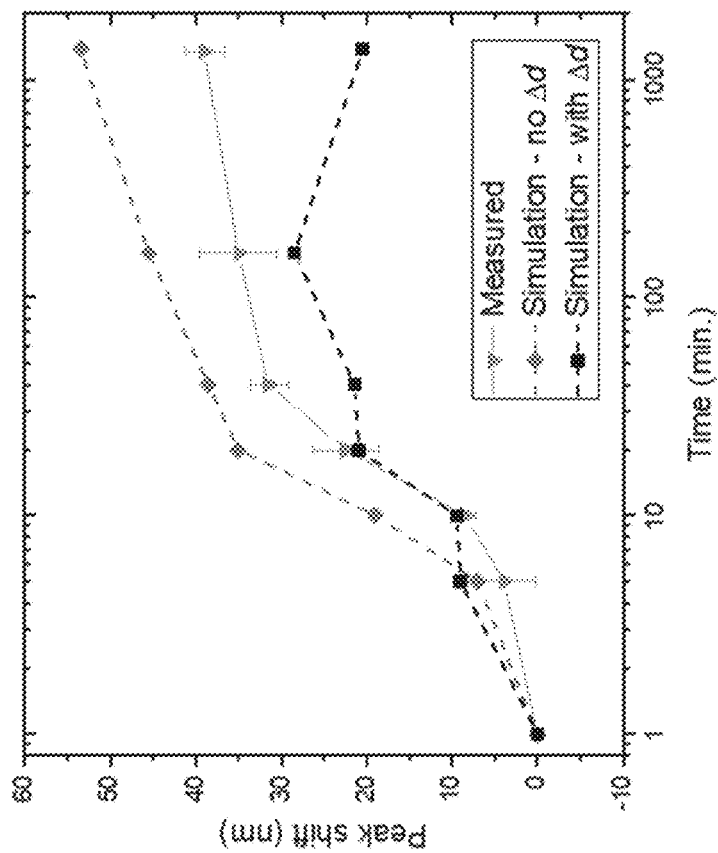
FIG. 10 depicts a plot of measured data for the peak shift for the filter shown in FIG. 7, according to an example embodiment.
Figure 9:
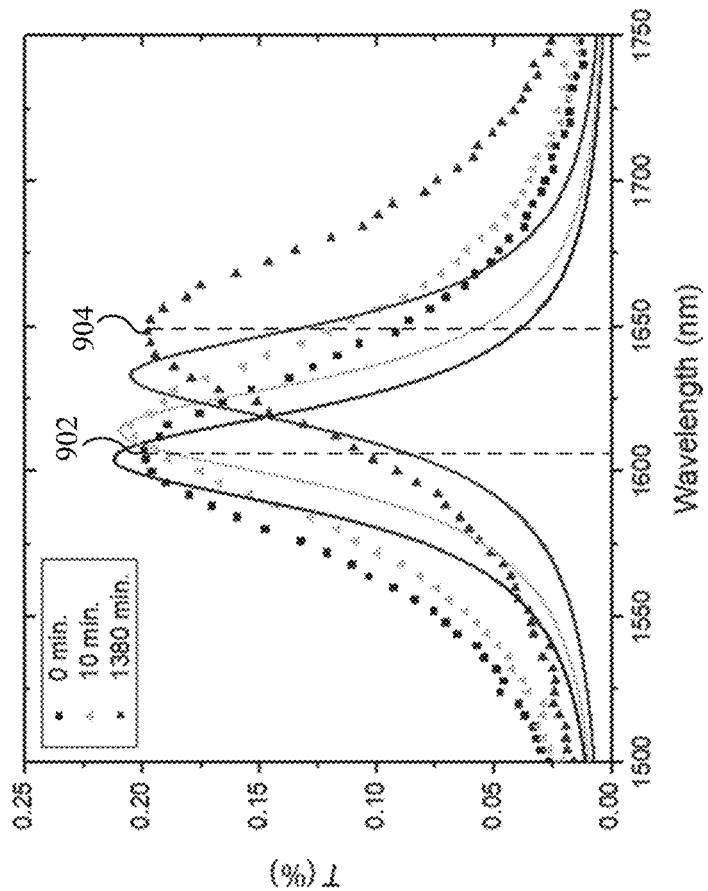
FIG. 9 depicts a plot of measured data for the transmittance of the filter shown in FIG. 7 along with simulated results, according to an example embodiment.

Measured results are shown in FIGS. 9 and 10 for the filter embodiment that includes 277.8 nm thick arsenic selenide ($As_2Se_3$) film sandwiched between 30 nm thick layers of aluminum on a silica ($SiO_2$) substrate.

FIG. 9 is a plot of measured data for the transmittance of the filter shown in FIG. 7 along with simulated results, according to an example embodiment. Measured data are shown as points, and simulated results are shown as solid lines in FIG. 9. Simulated results account for a change in thickness, M. The as-deposited peak wavelength is shown as 902 and the desired peak wavelength is shown as 904 in FIG. 9. A maximum in transmittance, T, is observed at approximately 0.2% at a wavelength of 1600 nm prior to annealing, with a maximum red shift, i.e., a shift to longer wavelengths, of 40 nm after 1380 minutes of annealing. As seen in FIG. 9, the model predicts the resonance position and peak value of T accurately. It underestimates the width of the reflectance peak by approximately a factor of two, probably because variations in film thickness broaden the peak.

FIG. 10 is a plot of measured data for peak shift the filter shown in FIG. 7, according to an example embodiment. The plot also shows two sets of simulated results, one accounting for the change in thickness, M, and the other neglecting it. Before accounting for M, the model overestimates the peak shift, predicting a change of 53.5 nm. After accounting for the thickness change, the model underestimates the peak shift, predicting a maximum shift of 28.5 nm. It is possible that the aluminum reflector layers explain this discrepancy. Some of the thickness change in the reference sample (e.g., film stack 204 shown in FIG. 2) is likely due to selenium loss during annealing. In the case of the Fabry-Perot sample (e.g., filter 700 shown in FIG. 7), however, the aluminum layer may act as a barrier, preventing selenium loss. While the thickness still changes somewhat, the effect is not as pronounced as in the case of the uncoated reference sample, so the experimental results lie in between modeling results that do not account for thickness change and those that account for the full change observed in the reference sample.

Figure 11:
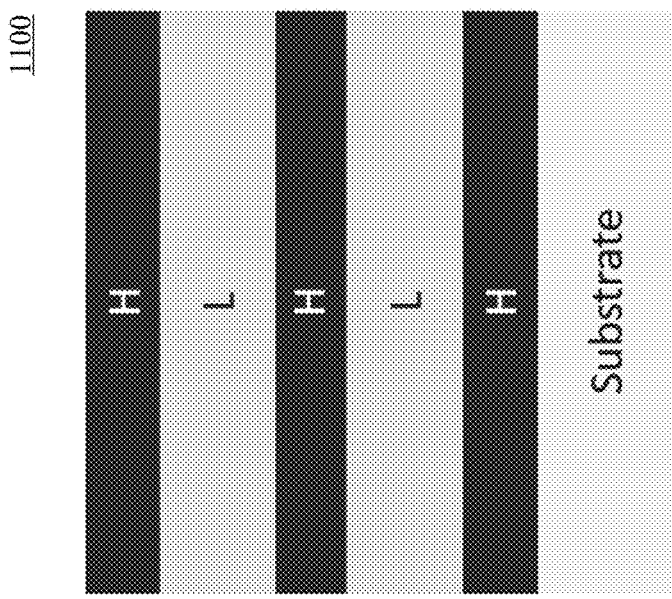
FIG. 11 depicts a Bragg reflector, according to an example embodiment.

FIG. 11 depicts a Bragg reflector or mirror, according to an example embodiment. Reflector 1100 shown in FIG. 11 includes five alternate low (L) and high (H) refractive index layers with a design of HLHLH on a substrate (e.g., silica) where at least one set of layers (the L or the H layers) is a ChG. This embodiment is intended for high reflectance, R, across a range of wavelengths. In embodiments, one L and one H layer may be utilized. In other embodiments, any arbitrarily large number of each L and H layers may be utilized, with the layers being repeated alternately, optimally ending with an H as the top layer. The larger the total number of layers, the higher the peak reflectance of the device will be. Each layer may be approximately one quarter of a wavelength, at the wavelength of interest, in thickness. The long wavelength cutoff in reflectance, R, that is the wavelength at which R falls to half of its maximum value, may be adjusted by thermal tuning.

In an example embodiment, reflector 1100 may be fabricated on a silica substrate. The H layers may be formed of arsenic selenide ($As_2Se_3$) with a thickness of 138.9 nm, approximately a quarter wave at a wavelength of 1550 nm. The L layers may be formed of calcium fluoride ($CaF_2$) with a thickness of 271.7 nm, also approximately a quarter wave at a wavelength of 1550 nm. In embodiments, each of the L and H layers may be composed of different material.

Figure 12:
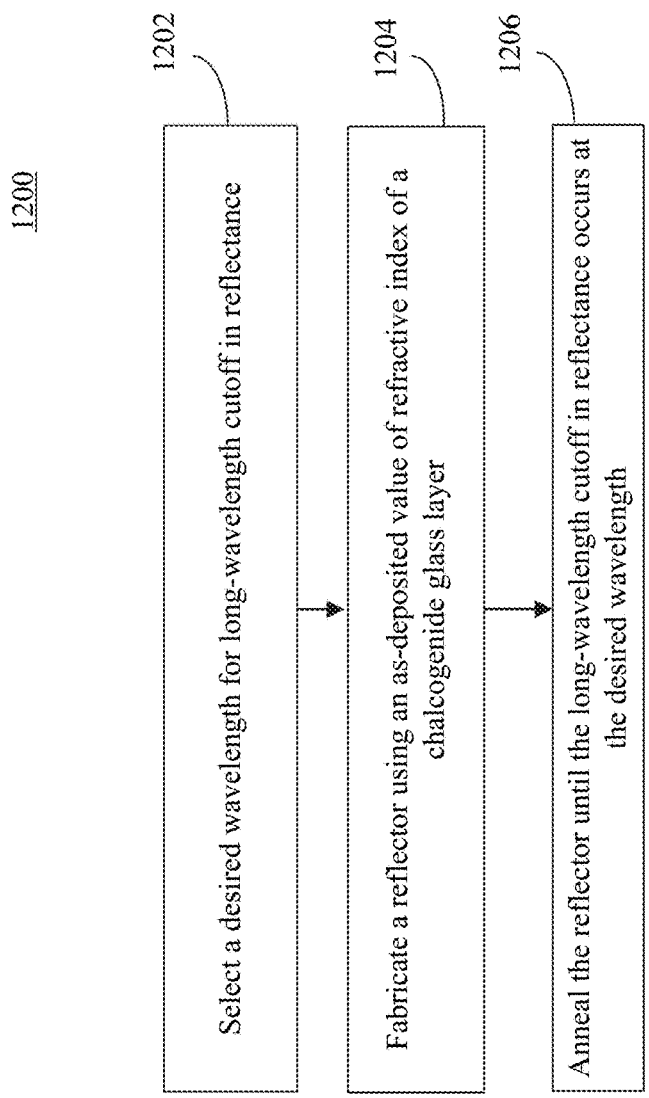
FIG. 12 depicts a flowchart of a method for forming a reflector, according to an example embodiment.

FIG. 12 is a flowchart 1200 of a method for forming a reflector (e.g., reflector 1100 shown in FIG. 11), according to an example embodiment. Flowchart 1200 begins with step 1202 in which a desired wavelength for long-wavelength cutoff in reflectance is selected. Based on the application and/or configuration of the reflector, a particular wavelength for long-wavelength cutoff in reflectance, R, may be selected. In step 1204, a reflector is fabricated with an as-deposited refractive value of refractive index of a chalcogenide layer. For example, chalcogenide glasses may have different refractive index values depending on their composition. The intermediate value may be a value that is dependent on the refractive index value for the chalcogenide glass used, such as an average of the as-deposited and fully annealed values. In step 1206, the reflector is annealed until the long-wavelength cutoff in reflectance occurs at the desired wavelength. For example, once the reflector is fabricated and annealed, its optical response may be measured to determine whether the desired wavelength is achieved. If not, the reflector may be further annealed and measured until the desired wavelength for long-wavelength cutoff in reflectance is reached, at which point the tuning process may be terminated.

Figure 14:
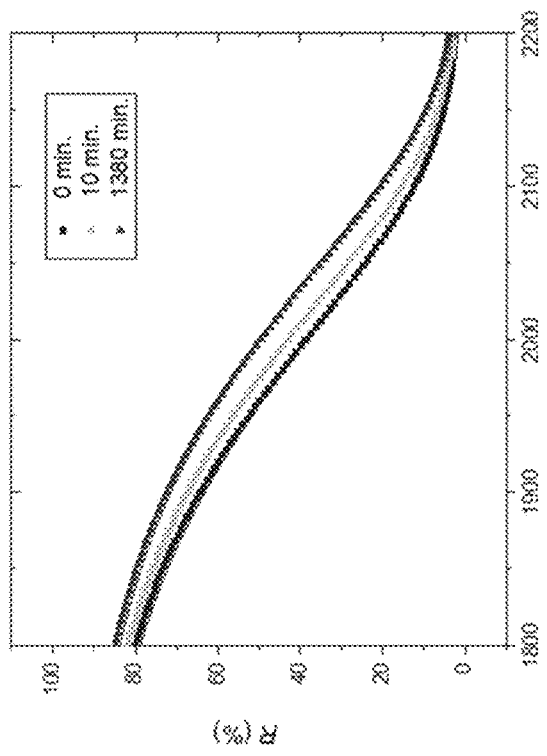
FIG. 14 depicts a plot of the long-wavelength edge of a reflector showing measured and simulated data for a reflectance curve for several anneal times.
Figure 15:
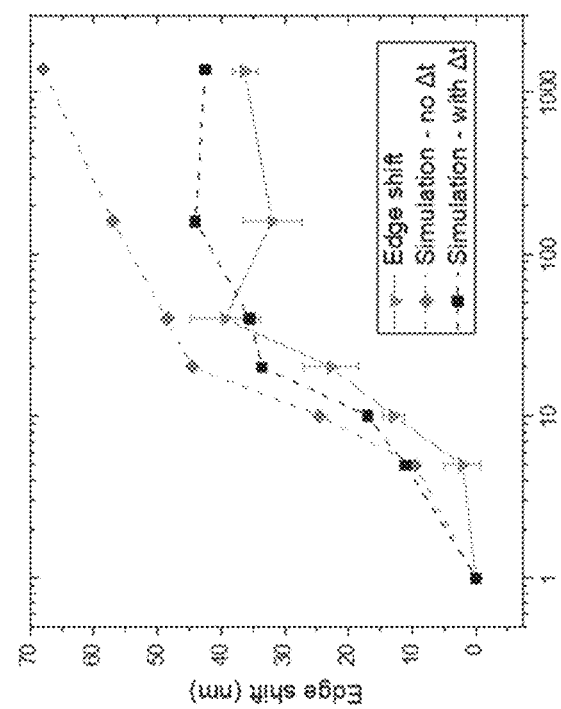
FIG. 15 depicts a plot of the long-wavelength edge of a reflector showing the shift in the edge of the reflectance band.
Figure 13:
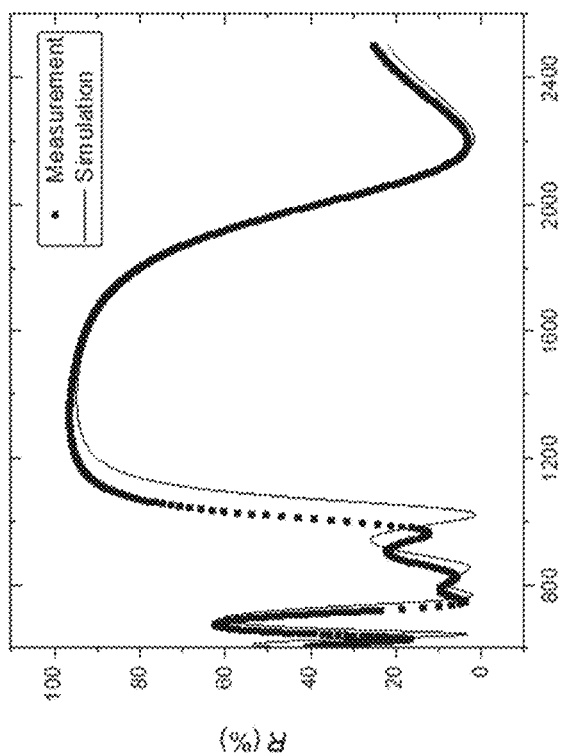
FIG. 13 depicts a plot of measured and simulated values for the reflectance for the entire main reflectance peak of an unannealed reflector.

FIGS. 13-15 depict plots of measured and simulated data related to a reflector embodiment described above and depicted in FIG. 11. The reflector includes arsenic selenide H layers and calcium fluoride L layers (five total) with respective thicknesses of 138.9 nm and 271.7 nm.

FIG. 13 depicts a plot of measured and simulated values for the reflectance for the entire main reflectance peak of an unannealed reflector sample (e.g., reflector 1100 shown in FIG. 11). The model, as described above, was used to generate the simulated values. As shown in FIG. 13, a broad, flat peak in reflectance, R, spanning from approximately 900 nm to 1900 nm with a peak R of approximately 96%. This is excellent performance for a Bragg reflector having only five layers and results from the high index contrast between the arsenic selenide and calcium fluoride layers. There is a red shift on the long-wavelength side of the reflectance curve that increases with annealing time. The model reproduces the value of peak reflectance and the general shape of the peak accurately. Similar to the filter example, the model underestimates the width of the distribution, predicting a short-wavelength edge position about 60 nm longer than its actual position, likely because of thickness variations in the fabricated samples.

FIG. 14 depicts a plot of the long-wavelength edge of a reflector showing measured and simulated data for a reflectance curve for several anneal times. The plot shows good agreement between the simulated data and measured results.

FIG. 15 depicts a plot of the long-wavelength edge of a reflector showing the shift in the edge of the reflectance band, measured at the point of 50% of peak reflectance, R. The plot also shows two simulated results for R, one accounting for the change in thickness, $\Delta d$, and the other neglecting it. Upon annealing, the long-wavelength edge is red shifted by up to 40 nm while the short wavelength edge position remains fixed. Before accounting for thickness change, the model again overestimates the shift, predicting a shift of 68 nm. When accounting for thickness change, the model's prediction of 42.5 nm is close to the measured value. Furthermore, the model accurately predicts the maximum value of R and the fact that the short wavelength edge remains fixed after annealing.

Note that the methods (e.g., in flowcharts 600, 800 and 1200 shown in FIGS. 6, 8 and 12, respectively) are non-limiting examples. Other methods may be utilized to form the optical devices described herein. In addition, the steps of the flowcharts may be performed in an order different than shown in the respective figure in some embodiments. Furthermore, more or fewer steps may be performed in any of the methods.

As described herein, post-deposition thermal tuning may permit performance matching and improved uniformity across an array of multiple devices, which may have slightly different optical behavior due to variations in film thickness or other properties. In addition, post-deposition thermal tuning may be used to create optical gradients or otherwise purposefully non-uniform optical properties, for example, a phase gradient, across a large area device or array of devices, eliminating the need for additional fabrication steps.

In an embodiment, a long-pass filter may be deposited on or placed proximate to an optical device in order to prevent short-wavelength light from exposing the chalcogenide layer(s). Short-wavelength light is known to cause degradation of some ChG films. In general, optical devices may be designed and fabricated for use anywhere in the transparency range of the associated ChG layers. These devices may be optimized for wavelengths from the visible (400 nm) to the long range infrared (up to 12 µm), depending on ChG composition.

CONCLUSION

While various embodiments of the disclosed subject matter have been described above, it should be understood that they have been presented by way of example only, and not limitation. Various modifications and variations are possible without departing from the spirit and scope of the described embodiments. Accordingly, the breadth and scope of the disclosed subject matter should not be limited by any of the above-described exemplary embodiments.

What is claimed is:

1. An optical reflector device comprising:
a substrate;
a first reflector layer on the substrate;
a chalcogenide glass layer on the first reflector layer so that the first reflector layer is between the chalcogenide glass layer and the substrate; and
a second reflector layer on the chalcogenide glass layer so that the chalcogenide glass layer is between the first reflector layer and the second reflector layer;
wherein at least one of the first reflector layer and the second reflector layer comprises a dielectric stack, and wherein the chalcogenide glass layer has an optical index of refraction that is configured to be thermally tuned while physically between the first and second reflector layers post deposition to adjust a wavelength response of the optical reflector device.

2. The optical reflector device of claim 1, wherein the chalcogenide glass layer comprises at least one chalcogen element that includes sulfur, selenium, or tellurium.

3. The optical reflector device of claim 1, wherein the chalcogenide glass layer comprises at least one network former that includes gallium, germanium, arsenic, indium, antimony, or lead.

4. The optical reflector device of claim 1, wherein the chalcogenide glass layer comprises a halide.

5. The optical reflector device of claim 1, the optical reflector device being configured to operate in a range that includes visible through long range infrared wavelengths.

6. The optical reflector device of claim 1, wherein the optical device is configured to be a filter, and
wherein the chalcogenide glass comprises arsenic selenide and the substrate comprises sapphire.

7. The optical reflector device of claim 1, wherein the chalcogenide glass layer is in a non-equilibrium state.

* * * * *